(12) United States Patent
Agarwala et al.

(10) Patent No.: US 6,734,090 B2
(45) Date of Patent: May 11, 2004

(54) METHOD OF MAKING AN EDGE SEAL FOR A SEMICONDUCTOR DEVICE

(75) Inventors: Birendra N. Agarwala, Hopewell Junction, NY (US); Hormazdyar Minocher Dalal, LaGrangeville, NY (US); Eric G. Liniger, Sandy Hook, CT (US); Diana Llera-Hurlburt, Fishkill, NY (US); Du Binh Nguyen, Danbury, CT (US); Richard W. Procter, Hopewell Junction, NY (US); Hazara Singh Rathore, Stormville, NY (US); Chunyan E. Tian, Hopewell Junction, NY (US); Brett H. Engel, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 10/078,861

(22) Filed: Feb. 20, 2002

(65) Prior Publication Data

US 2003/0157794 A1 Aug. 21, 2003

(51) Int. Cl.[7] .............................................. H01L 21/44
(52) U.S. Cl. ....................... 438/598; 438/599; 438/618; 438/637; 438/638; 438/666; 438/672; 438/700; 438/702
(58) Field of Search ................................. 438/637–639, 438/687, 121, 462, 597, 598, 599, 618, 620, 666–669, 672, 700, 702

(56) References Cited

U.S. PATENT DOCUMENTS

| 6,133,144 | A | | 10/2000 | Tsai et al. | |
|---|---|---|---|---|---|
| 6,140,220 | A | | 10/2000 | Lin | |
| 6,143,646 | A | * | 11/2000 | Wetzel | 438/637 |
| 6,200,890 | B1 | | 3/2001 | Chen | |
| 6,268,294 | B1 | | 7/2001 | Jang et al. | |
| 6,287,960 | B1 | | 9/2001 | Lao | |
| 6,313,024 | B1 | * | 11/2001 | Cave et al. | 438/598 |
| 6,326,301 | B1 | * | 12/2001 | Venkatesan et al. | 438/638 |
| 6,362,524 | B1 | * | 3/2002 | Blish et al. | 438/687 |
| 6,365,958 | B1 | * | 4/2002 | Ibnabdeljalil et al. | 438/462 |
| 6,372,636 | B1 | * | 4/2002 | Chooi et al. | 438/639 |
| 6,521,975 | B1 | * | 2/2003 | West et al. | 438/462 |
| 2003/0104688 | A1 | * | 6/2003 | Wade | 438/622 |

OTHER PUBLICATIONS

M. Chow, et al, Research Disclosure, Aug. 1990, No. 316, "Polyimide Vias with Nitride Sidewall structure for Improved Tungsten Fill".

* cited by examiner

Primary Examiner—Lynne Gurley
(74) Attorney, Agent, or Firm—Ira D. Blecker

(57) ABSTRACT

An edge seal around the periphery of an integrated circuit device which environmentally protects the copper circuitry from cracks that may form in the low-k interlevel dielectric during dicing. The edge seal essentially constitutes a dielectric wall between the copper circuitry and the low-k interlevel dielectric near the periphery of the integrated circuit device. The dielectric wall is of a different material than the low-k interlevel dielectric.

9 Claims, 7 Drawing Sheets

METHOD OF MAKING AN EDGE SEAL FOR A SEMICONDUCTOR DEVICE

BACKGROUND OF THE INVENTION

The present invention relates generally to a new semiconductor process and structure, and more particularly, to a new semiconductor process and structure which provides an edge seal with improved resistance to crack propagation and impurity ingress in semiconductor devices (also referred to herein as integrated circuit devices) with preferably high conductivity copper metallurgy and low-k dielectric material.

Semiconductor device interconnection technology has made giant advancements to meet the requirements of increased device density and circuit performance. To meet the ever increasing device density demand, a double damascene method for interconnecting the semiconductor devices is widely utilized. Among other attributes of double damascene methodology, it allows the definition of a pattern of interconnection lines and via-studs with essentially no restriction on materials used or number of layers of materials used in the interconnection. This feature of damascene methodology allowed the introduction of copper metallurgy which requires a variety of barrier layers and different metal deposition methods. In order to meet the improved circuit performance by reducing the parasitic impedance losses, it was soon found that a low dielectric constant ("low-k") dielectric material is essential to complement the increased conductivity offered by copper metallurgy. Accordingly, low-k dielectric material and copper metallurgy interconnection defined by dual damascene methodology is the present day choice for interconnections in high performance semiconductor device processing.

One of the main drawback of this scheme is the high corrosion and oxidation susceptibility of copper metal. To protect copper features from corrosion, a variety of barrier metals, for example tantalum/tantalum nitride, are used as sheathing for copper interconnection lines and via-studs. However, these barrier layers reduce the cross section of the high conductivity interconnection lines and via-studs and hence must be made as thin as possible. For feature widths in the tenth of a micron regime, the film thickness allowed for each barrier layer is about 80 A°, which is barely one or two grains thick. This thickness, however, is adequate to prevent copper corrosion and oxidation by impurities in the surrounding dielectric provided the ingress of impurities through the chip edge is prevented.

An edge seal around the periphery of a semiconductor device has been proposed by others to act as a firewall to prevent ingress of oxygen, moisture or any impurity from chip edges. One embodiment of a present art edge seal, partly shown in FIG. 1, comprises stacked via-studs (CA, V1, . . . ) and copper interconnection lines (M1, M2, . . . ) surrounded by inter-level dielectric (D1, D2, . . . ) and composite dielectric layers of BLOK hard mask (HM1, HM2, . . . ) and silicon-nitride cap (SN1,SN2, . . . ). BLOK (trademark of Applied Materials Inc.) is a plasma enhanced chemical vapor deposition (PECVD) deposited silicon carbide film. The coupled contact array (CA) via-studs and M1 interconnection lines, or V1 via-studs and M2 interconnection lines, are comprised of copper metallurgy and defined simultaneously by a double damascene method as is well known to those skilled in the art. The composite dielectric layers HM1/SN1, HM2/SN2, etc. are necessary layers in a double damascene method for improved process yield and reliability of interconnections.

The damascene process will be briefly described. Following the formation of tungsten or silicon local interconnects M0, a first inter level dielectric layer D1 and BLOK hard mask layer HM1 is deposited. Usually, a via-stud pattern CA is first photolithographically defined in HM1 and the HM1 is etched followed by a partial etch of D1. A pattern for next level of interconnection line M1 is then photolithographically defined in HM1, the HM1 etched and the D1 is etched until the underneath metal M0 is exposed. This is followed by deposition of TaN/Ta barrier layers, a copper seed layer and electroplated copper. The wafer is then chemically mechanically (hereafter chem-mech) polished by conventional methods to remove excess metals atop HM1. The BLOK hard mask layer (HM1) is essential for stopping the chem-mech polishing operation on a planar surface. A silicon nitride layer (SN1) is then deposited to improve the adhesion of the next level of materials. This SN1 layer gets etched out underneath the via-studs V1 during the operation to form the next level of via-stud/interconnection lines. The process is repeated as many times as the number of interconnection levels required.

Whereas the present day edge seal with silicon dioxide interlevel dielectric is generally satisfactory, the present day edge seal scheme is inadequate for corrosion protection when a low-k dielectric, usually a porous material with high permeability for moisture and oxygen, e.g. SiLK, is used for the interlevel dielectric. SiLK (a trade mark of Dow Chemical Co., Midland, Mich.) is a fluorinated organic polymer and when spun on a semiconductor wafer and cured at about 400° C., forms a low-k dielectric film. During the wafer dicing operation, cracks are easily initiated from the chipping of the edge of the diced semiconductor device (shown in FIG. 1). The crack initiation is more pronounced at the interface of the SiLK and the nitride cap as shown in FIG. 2. The weak adhesion between SiLK and the nitride cap provides an easy path for propagation of cracks generated by the wafer dicing operation, thereby exposing the edge seal metallurgy to the ambient, which leads to corrosion of the edge seal. The volume expansion of the corroded edge seal metallurgy generates yet another series of cracks leading towards the interconnections, which in turn corrode and cause device failure.

Accordingly, methods must be sought to reduce crack generation and crack propagation propensity.

Tsai et al. U.S. Pat. No. 6,133,144, the disclosure of which is incorporated by reference herein, discloses a double damascene method in a silicon dioxide dielectric having copper wiring to reduce the parasitic capacitance by reducing the effective inter level dielectric thickness, without removal of any etch barrier layer, by a judicial design and masking scheme.

Lin U.S. Pat. No. 6,140,220, the disclosure of which is incorporated by reference herein, discloses incorporating a silicon nitride sleeve around a copper via-stud with an objective to increase the conductive cross-section of via-stud. The dielectric layer is silicon dioxide. Whereas this silicon nitride sleeve may provide an added barrier for via-studs, it fails to protect the whole edge-seal structure because the sidewalls of the conductor lines do not have this added barrier of silicon nitride.

Chen U.S. Pat. No. 6,200,890, the disclosure of which is incorporated by reference herein, discloses providing an oxide layer over the top surface and top half of the sidewalls of copper conductor lines with an objective to improve electromigration life in copper metallurgy and to reduce intra-level leakage. Accordingly, application of Chen's scheme will not meet the objective to cover the sidewalls of the edge seal, which is comprised of interconnection lines as well as via-studs. Moreover, while Chen mentions the use of a low-k material, his teachings are not directly applicable if the low-k dielectric is SiLK, since Chen does not address the extremely high polishing rate of SiLK.

Jang et al. U.S. Pat. No. 6,268,294, the disclosure of which is incorporated by reference herein, discloses a method to chemically passivate the etched sidewalls of dielectric prior to filling the damascene cavity with metals. This reacted layer provides an added barrier layer but it fails to protect the whole edge-seal structure because the sidewalls of the conductor lines do not have this added barrier. Further, this method is specifically directed to polymeric dielectrics and is not applicable to chemically inert dielectric material like SiLK.

Lao U.S. Pat. No. 6,287,960, the disclosure of which is incorporated by reference herein, discloses the problem of how to center the stud part of a dual damascene structure relative to the trench part wherein an oxide dielectric and copper wiring are utilized.

Chow et al. IBM Research Disclosure Number 316 (August 1990), the disclosure of which is incorporated by reference herein, discloses a method to provide a silicon oxide or silicon nitride sidewall spacer around tungsten via-studs in a polyimide dielectric to avoid interaction of the tungsten with moisture evolving from the polyimide. The disclosed method, however, fails to protect the whole edge seal structure because the sidewalls of the conductor lines do not have this added barrier.

Bearing in mind the problems and deficiencies of the prior art, it is therefore a purpose of the present invention to provide a semiconductor device having copper interconnections and low-k dielectric with an edge seal which is resistant to ingress of impurities and thereby more resistant to corrosion.

Another purpose of the present invention is to provide an edge seal which is more resistant to initiation and propagation of dicing induced cracks.

It is another purpose of the present invention to provide a wall of dense dielectric material along side the metal edge seal wall.

It is yet another purpose of the present invention to provide a fabrication method of a semiconductor device having a composite dielectric comprising a low-k dielectric material and a hard mask layer whereby the hard mask layer of the composite dielectric does not extend up to the metallurgy of the edge seal.

BRIEF SUMMARY OF THE INVENTION

The purposes of the invention have been achieved by providing, according to a first aspect of the present invention, a method of forming an edge seal along a periphery of an integrated circuit device to provide increased corrosion and oxidation resistance to metallization of the integrated circuit device, the method comprising the steps of:

a. providing a semiconductor substrate having a metallic feature therein;

b. depositing a layer of dielectric material over the semiconductor substrate and metallic feature, the layer of dielectric material comprising a low-k dielectric material;

c. selectively removing a portion of the layer of dielectric material to form a cavity and expose a portion of the metallic feature;

d. conformally depositing a layer of an insulation material in the cavity and over the layer of dielectric material, wherein the insulation material and dielectric material are different materials;

e. removing horizontal portions of the layer of insulation material so as to expose at least the metallic feature in the cavity;

f. depositing a barrier metal on the layer of insulation material in the cavity and on the exposed metallic feature;

g. depositing a high conductivity metal in the cavity to fill the cavity; and h. planarizing the semiconductor substrate down to the layer of dielectric material.

According to a second aspect of the present invention, there is provided an edge seal around the periphery of an integrated circuit device comprising:

a. a semiconductor substrate;

b. a layer of dielectric material over the semiconductor substrate, the layer of dielectric material comprising a low-k dielectric material;

c. a metallic wall of a high conductivity metal in the layer of dielectric material; and d. a layer of insulation material between the metallic wall and the dielectric material, wherein the insulation material and dielectric material are different materials.

According to a third aspect of the present invention, there is provided a method of forming an edge seal along a periphery of an integrated circuit device to provide increased corrosion and oxidation resistance to metallization of the integrated circuit device, the method comprising the steps of:

a. providing a semiconductor substrate having a metallic feature therein;

b. depositing a layer of dielectric material over the semiconductor substrate and metallic feature, the layer of dielectric material comprising a low-k dielectric material;

c. selectively removing a portion of the layer of dielectric material to form two first cavities and expose a portion of the metallic feature;

d. depositing an insulation material to fill the two first cavities, wherein the insulation material and dielectric material are different materials;

e. selectively removing a portion of the layer of dielectric material, and any overlying insulation material to form a second cavity;

f. depositing a barrier metal in the second cavity and on the exposed metallic feature;

g. depositing a high conductivity metal in the second cavity to fill the cavity; and h. planarizing the semiconductor substrate down to the layer of dielectric material.

According to a fourth aspect of the present invention, there is provided an edge seal around the periphery of an integrated circuit device comprising:

a. a semiconductor substrate;

b. a layer of dielectric material over the semiconductor substrate, the layer of dielectric material comprising a low-k dielectric material;

c. a metallic wall in the layer of dielectric material; and d. a wall of insulation material between the metallic wall and the periphery of the integrated circuit device wherein the insulation material and dielectric material are different materials.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
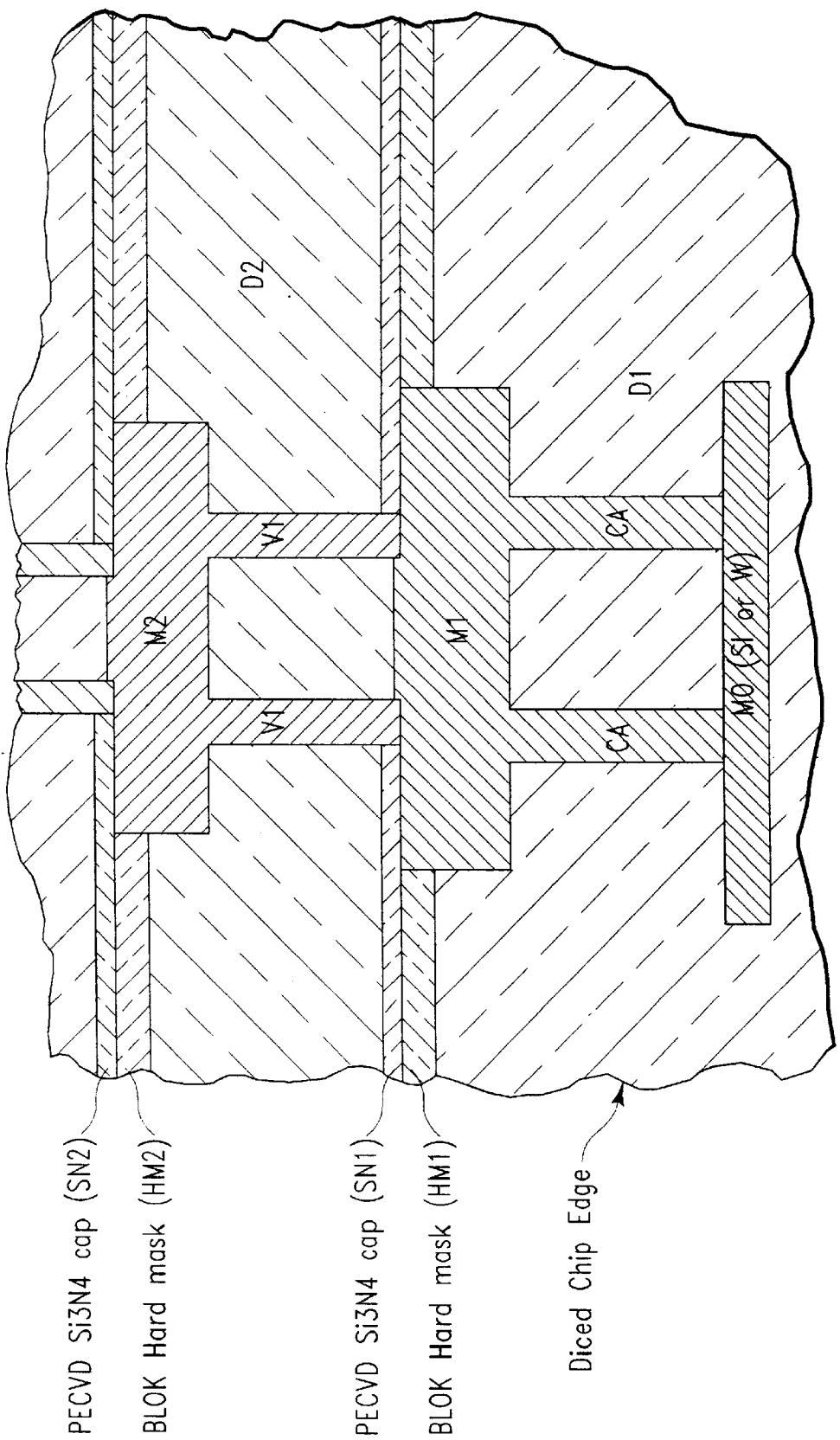
FIG. 1 is a cross-sectional side view of a prior art semiconductor device showing an all metallic edge seal of stacked metal via-studs and interconnection lines.
Figure 2:
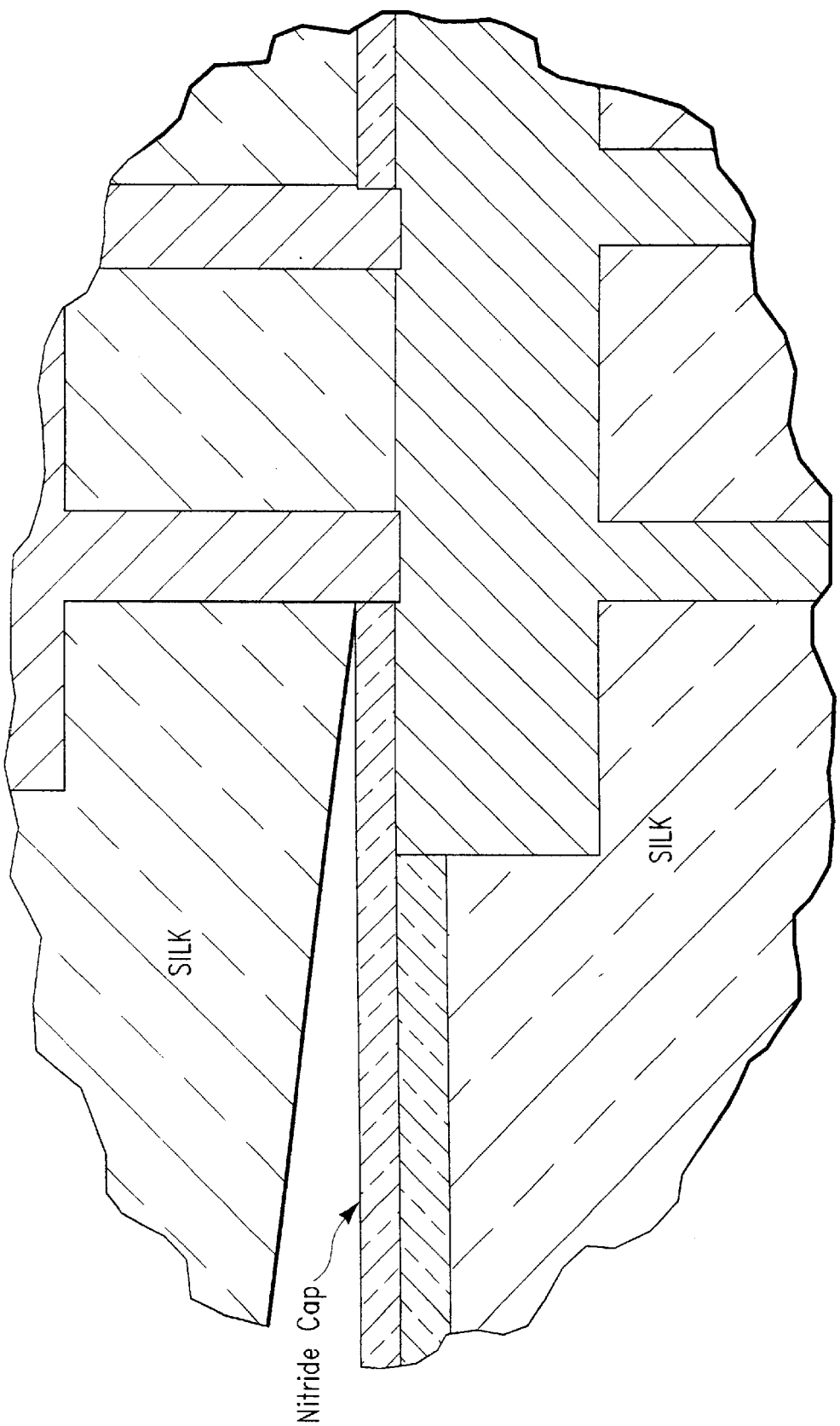
FIG. 2 is an enlarged cross-sectional view of a portion of FIG. 1, showing a crack from the diced chip edge proceeding along the interface of the hard mask and SiLK low-k dielectric material and terminating at the metallic edge seal wall.

The present invention is generally related to methods for forming metal filled via-studs and conductor lines on a substrate where the via-studs and conductor lines are formed using a double damascene method, and preferably copper metallurgy and low-k dielectric material. The present invention has particular relevance to semiconductor device edge seal schemes which preferably use copper or copper alloys and low-k dielectric since it has been discovered by the present inventors that even a coating of a dense oxide liner material on the edge seal metal wall can serve as an effective crack stop and diffusion barrier for copper.

Referring to the Figures in more detail, and particularly referring to FIG. 3A, there is shown a semiconductor substrate 10 overcoated with a composite of dielectric layers 12, 14, 16 which is subsequently patterned and metallized to form a plurality of semiconductor devices. The semiconductor substrate 10 is preferably silicon, gallium arsenide, or some other material which is suitable for making integrated circuits. The semiconductor substrate 10 preferably has a plurality of semiconductor devices (not shown) formed thereon which may include field effect transistors (FETs), bipolar transistors, resistors, Schottky diodes, or the like. It should be understood that the plurality of semiconductor devices on semiconductor substrate 10 are provided with contact studs 22 and local interconnections or wiring lines 24, typically tungsten with underlayers of titanium and titanium nitride (not shown), according to conventional practice. The local interconnects 24 of substrate 10 are preferably formed by conventional damascene methods, with the top surfaces of the local interconnects 24 being substantially planar with the surface of surrounding insulator 20, typically deposited boro-silicate or phospho-silicate glass or $SiO_2$.

The dielectric layers 12, 14, 16 comprise a bottom dielectric layer 12 of approximate thickness 20 to 50 nm, which may be PECVD deposited silicon nitride ($Si_3 N_4$), or the like, a thicker low-k dielectric layer 14, and a top dielectric layer 16 of a hard mask layer of approximate thickness 20 to 90 nm, e.g., BLOK or BLOK and silicon nitride, to act as a moisture barrier. The thickness of low-k dielectric layer 14 depends upon the combined thickness of the via-stud and interconnection line (to be discussed hereafter). The low-k dielectric material may be deposited by any of a number of well known techniques such as by growing in an oxidative atmosphere, sputtering, spun-on, or PECVD. Preferably, the low-k dielectric layer 14 is SiLK or an organic low-k dielectric such as a fluoridized polyimide and most preferably is SiLK. Alternative to the dielectric composite created by layers 12, 14, 16, although less preferred, a single layer of the low-k dielectric, may also be employed. It should be understood that the dielectric layer composite 12, 14, 16 is not limiting to the practice of this invention and that any low-k dielectric (e.g., inorganic or organic) used by itself or in combination with other dielectric materials could be employed in the practice of this invention.

Figure 3A:
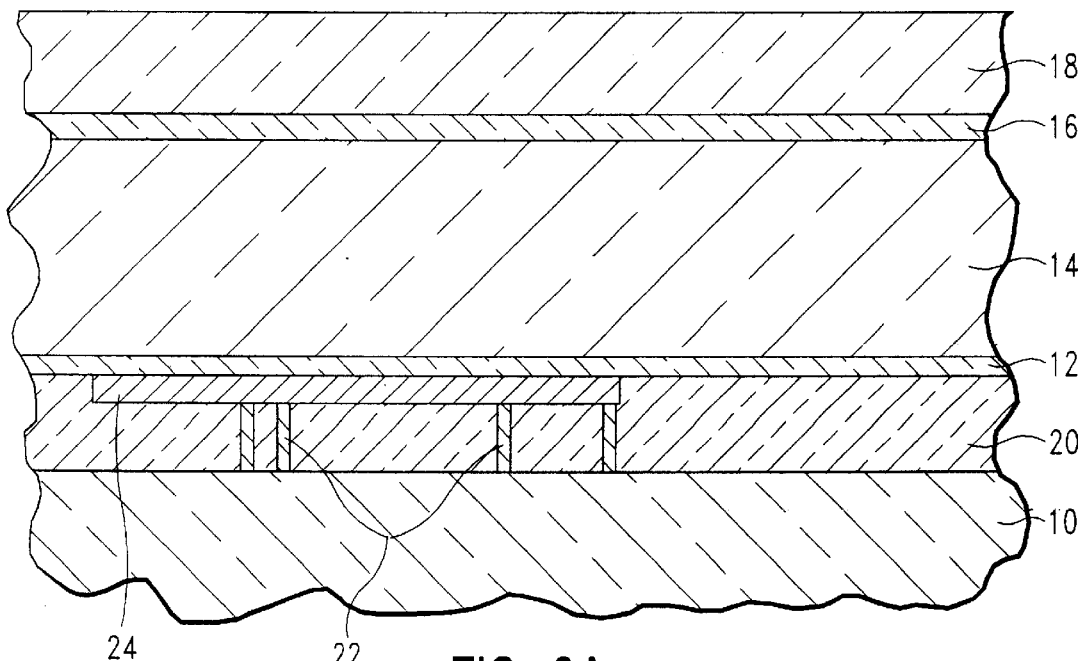
FIGS. 3A through 3F are sequential partial cross-sectional side views of a semiconductor substrate illustrating progressive steps of making an edge seal according to a first embodiment of the present invention.

Still referring to FIG. 3A, a layer 18 of PECVD $SiO_2$ or the like is next conformally deposited atop the dielectric composite layers 12, 14, 16. The layer 18 is essentially a sacrificial layer which provides mechanical rigidity to the underlying mechanically weaker low-k dielectric composite layers 12, 14, 16 during the processing steps for the interconnection formation.

Figure 3B:
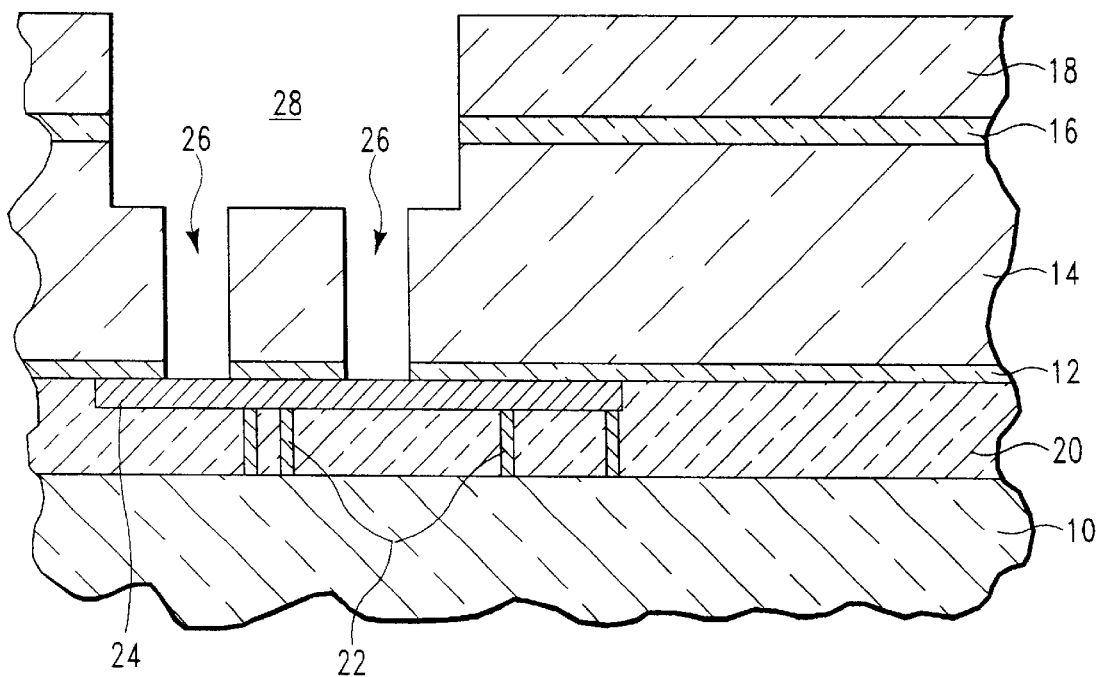

Referring now to FIG. 3B, a via-stud pattern is next defined atop layer 18, for example, by a photolithographic process, followed by sequential etching of layer 18, hard mask layer 16 and partially etching low-k dielectric 14 with suitable conventional etchants. The pattern for the high conductivity metal interconnection lines is next defined, again, for example, by a photolithographic process, followed by further etching of layer 18, hard mask 16, the remainder of low-k dielectric 14, and bottom dielectric layer 12 to form trenches 28 (for interconnection lines) and holes 26 (for via-studs) to expose metal line 24. The foregoing steps are initial process steps of the method conventionally known in the art as a double damascene method.

Figure 3C:
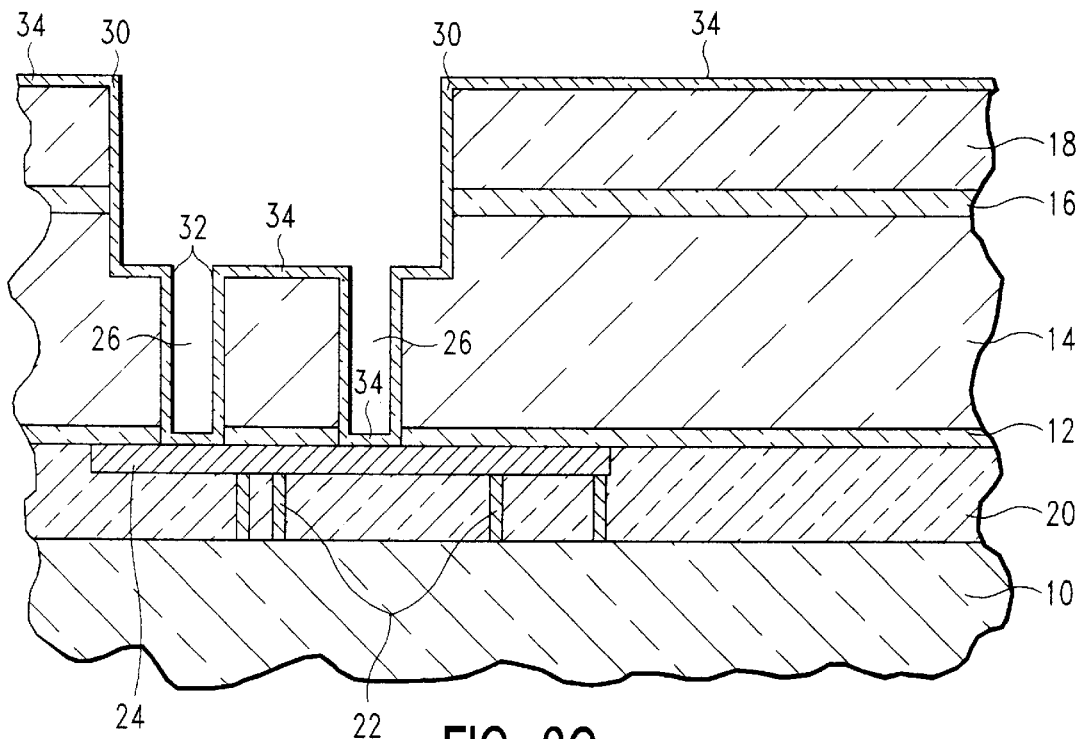

The present invention is implemented at the point in the process where the combined via-stud 26 and interconnection line 28 patterns are etched in composite layers 12, 14, 16, 18 to expose portions of metal line 24. Referring now to FIG. 3C, a dielectric layer 30 of preferably PECVD deposited $SiO_2$ of approximately 150 nm thickness is deposited. The dielectric layer 30 may be deposited by Electron Resonance Cyclotron (ECR), sputtering, high density plasma, PECVD, CVD, spin-coating or any combination of these methods. The dielectric layer 30 may also be made of polyimide, silicon-nitride, alumina, phospho-silicate glass, yttrium oxide, magnesium oxide, or any combination of these materials. The low-k dielectric 14 and dielectric layer 30 must not be the same material as dielectric layer 30 must be denser and more robust than low-k dielectric 14.

Figure 3D:
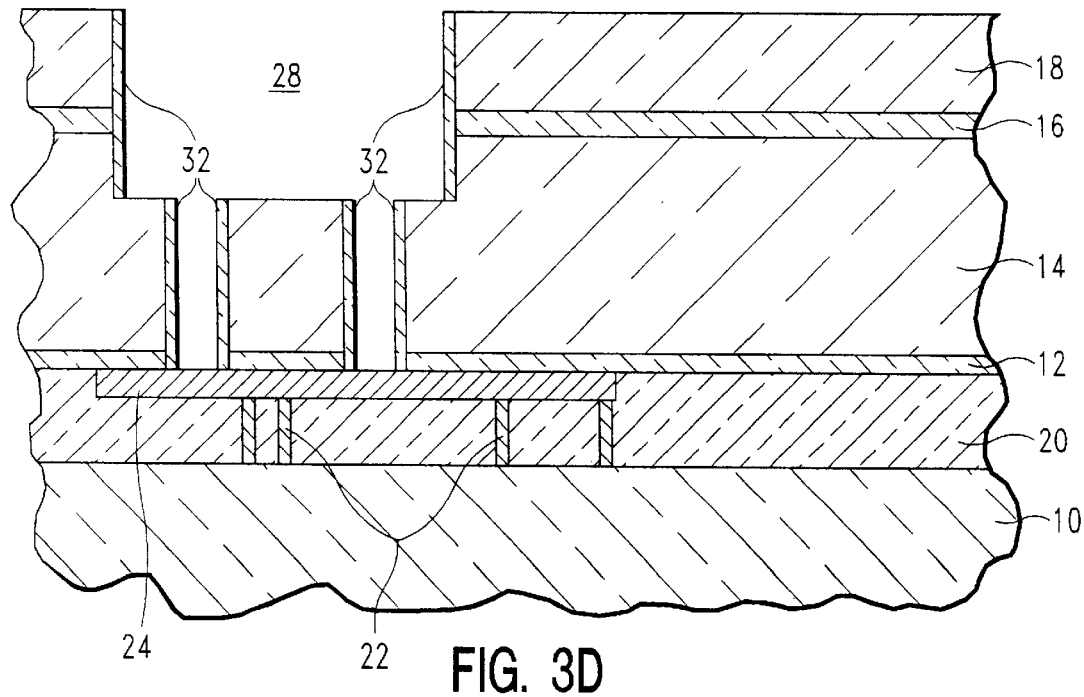

Next, substrate 10 and insulating layers 12, 14, 16, 18, 30 are subjected to a directional etch, for example a reactive ion etch (RIE) using any suitable etchant, e.g., fluoroform. The directional RIE etches horizontal parts 34 of the dielectric layer 30 at a rate much faster than the rate at which the vertical portions are etched. The RIE continues just long enough to remove the horizontal parts 34 of the dielectric layer 30 leaving only sidewalls 32 and to expose metal line 24, as shown in FIG. 3D.

Figure 3E:
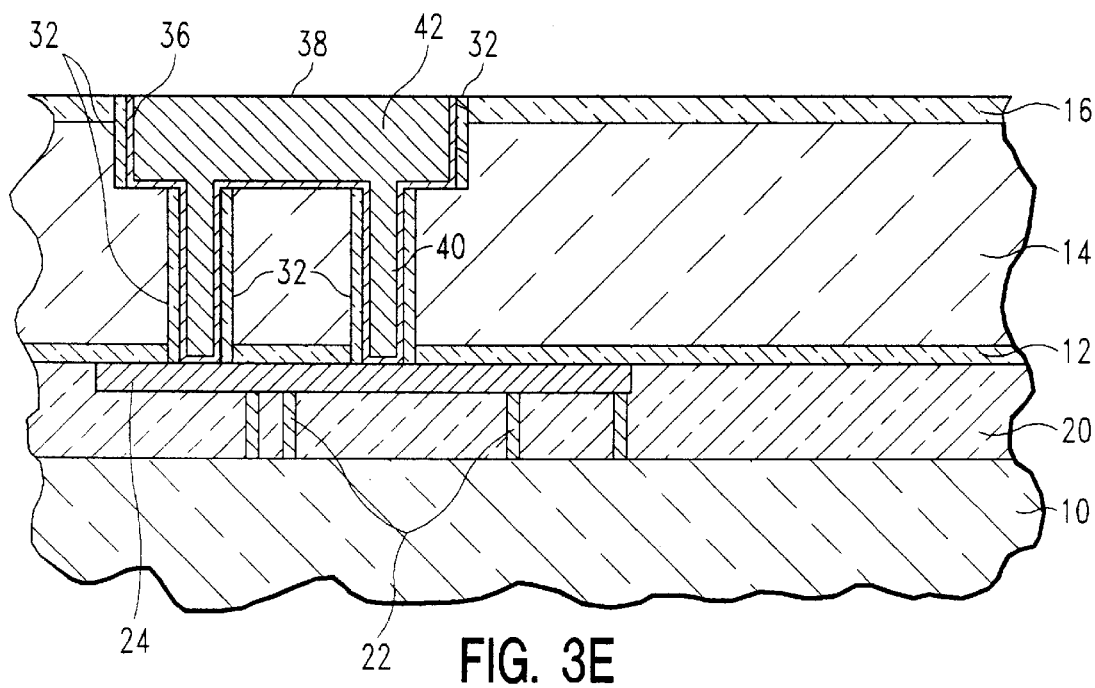

Referring now to FIG. 3E, a sequence of metal liner layers 36 is next deposited. The metal liner layers 36 comprise refractory materials tantalum, tantalum nitride, chromium/chromium oxide, titanium, titanium nitride, tungsten silicide, or the like, and a seed layer of copper deposited using any of the known deposition methods, such as, for example, CVD, sputtering, electroplating, or any combination of these or other similar methods. This is followed by deposition of copper 38 for via-studs 40 and interconnection lines 42 using electroplated methods. For certain applications it may be advantageous to follow the copper deposition by deposition of a refractory metal (not shown), particularly using a CVD process, e.g., CVD tungsten or its alloys, to act as a polish stop. Any excess metal materials are next removed in a singular or in a sequence of steps, such as, by chem-mech polishing to leave the integrated via-studs 40 and the interconnection lines 42, embedded in, and substantially planar with, the surrounding low-k dielectric 14 and BLOK layer 16, as shown in FIG. 3E.

It should be noted that via-studs 40 and interconnection lines 42 now have $SiO_2$ side walls 32 or similar dielectric as noted above. The $SiO_2$ side walls 32, having a few orders of magnitude higher density than the surrounding low-k dielectric 14 and also higher compressive stress, effectively reduces the propagation of dicing induced cracks, thereby protecting the metallurgy of via studs 40 and interconnection lines 42 from getting exposed to environmental ingress of gases, such as oxygen or moisture. Moreover, the hard material layers, i.e., bottom dielectric layer 12 and hard mask layer 16 are precluded from actually contacting the metal of via studs 40 and interconnection lines 42, thereby further restricting the crack path.

Figure 3F:
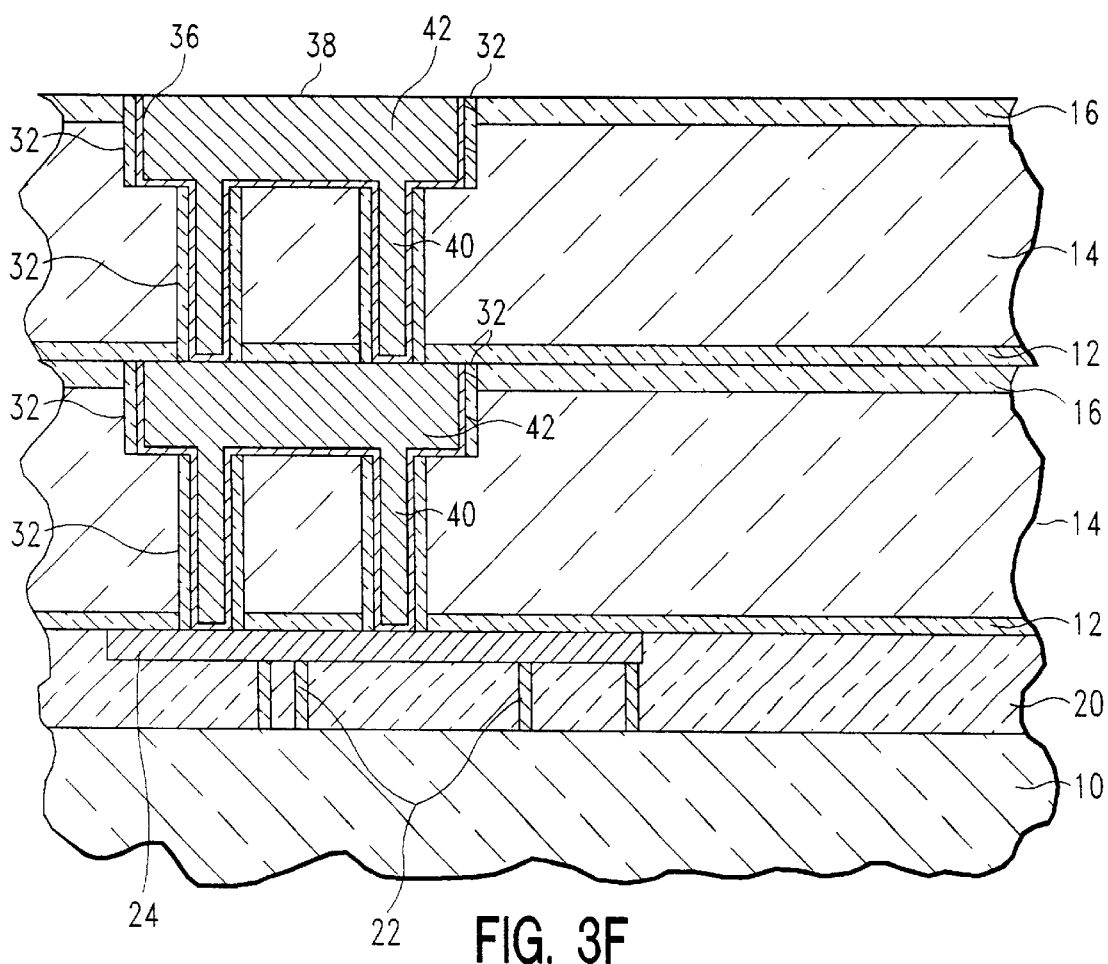

Referring now to FIG. 3F, it can be seen that the processing steps can be repeated to form multiple composite layers of bottom dielectric layer 12, low-k dielectric 14, hard mask layer 16, via-studs 40 and interconnection lines 42.

In double damascene methods, the metal edge seal wall formed by the stacked via-studs and interconnection lines are surrounded by, and in direct contact with, the originally chosen dielectric. The present invention provides the metal edge seal wall with a sheathing of a dielectric different from, and more robust than, the surrounding dielectric.

Figure 4A:
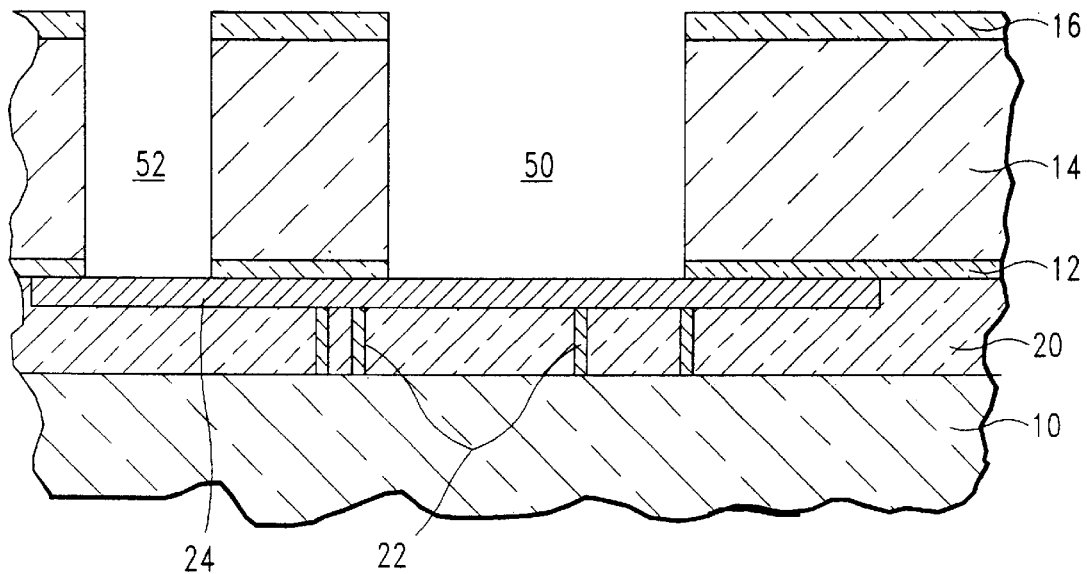
FIGS. 4A through 4D are sequential partial cross-sectional side views of a semiconductor substrate illustrating a second embodiment of the present invention.

In another embodiment of the present invention, the edge seal is comprised of dual walls with one wall being metallic and the other wall being made of a dielectric material. Referring first to FIG. 4A, a photolithographic pattern is defined atop composite dielectric layers 12, 14, 16 (dielectric layers 12, 14, 16 are the same as described previously) followed by etching thereof to form a set of cavities 50 and 52 and to expose metal line 24.

Figure 4B:
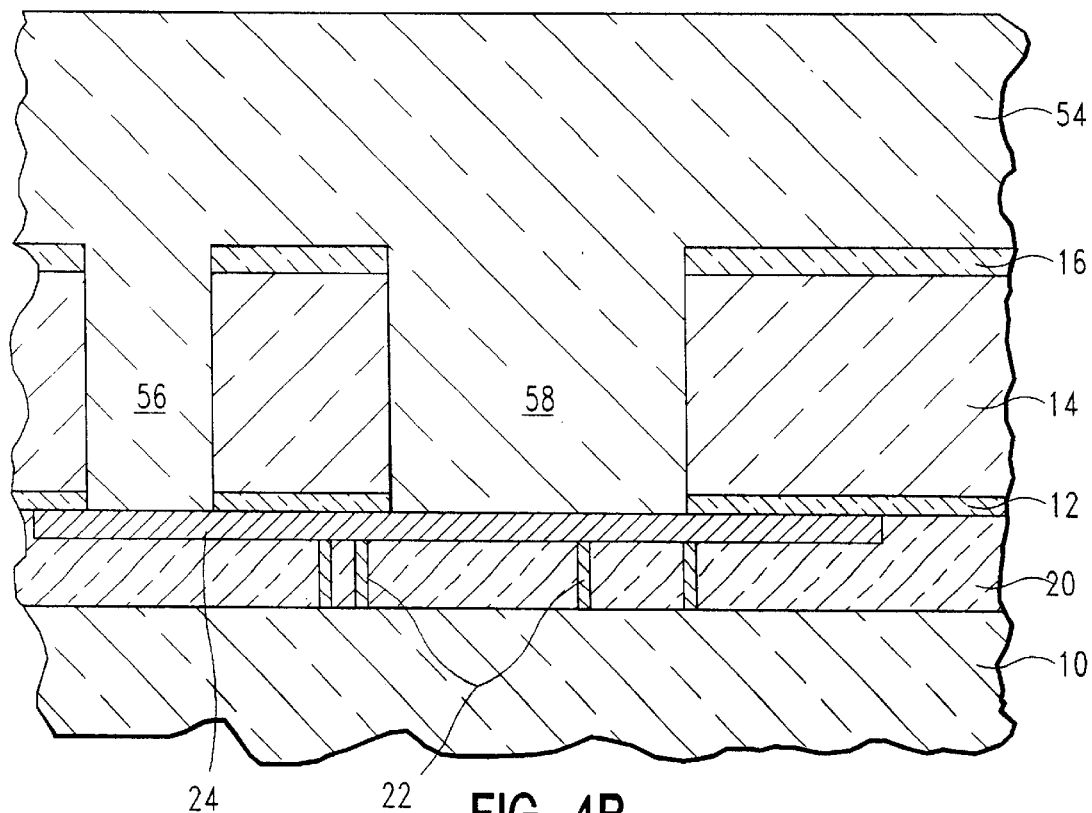

A thick layer 54 (0.8 μm to 1.5 μm thick) of PECVD $SiO_2$ is next deposited as shown in FIG. 4B. The cavities 50 and 52 are filled with this dielectric 54 to form the dual dielectric walls 58 and 56, respectively. The material of layer 54 also may be chosen so as to act as a diffusion barrier for a given chemical species. For example, a $Si_3N_4$ layer may be used to prevent sodium diffusion in addition to preventing diffusion of moisture or an MgO layer may be chosen to prevent diffusion of $O_2$ or $SO_2$.

Figure 4C:
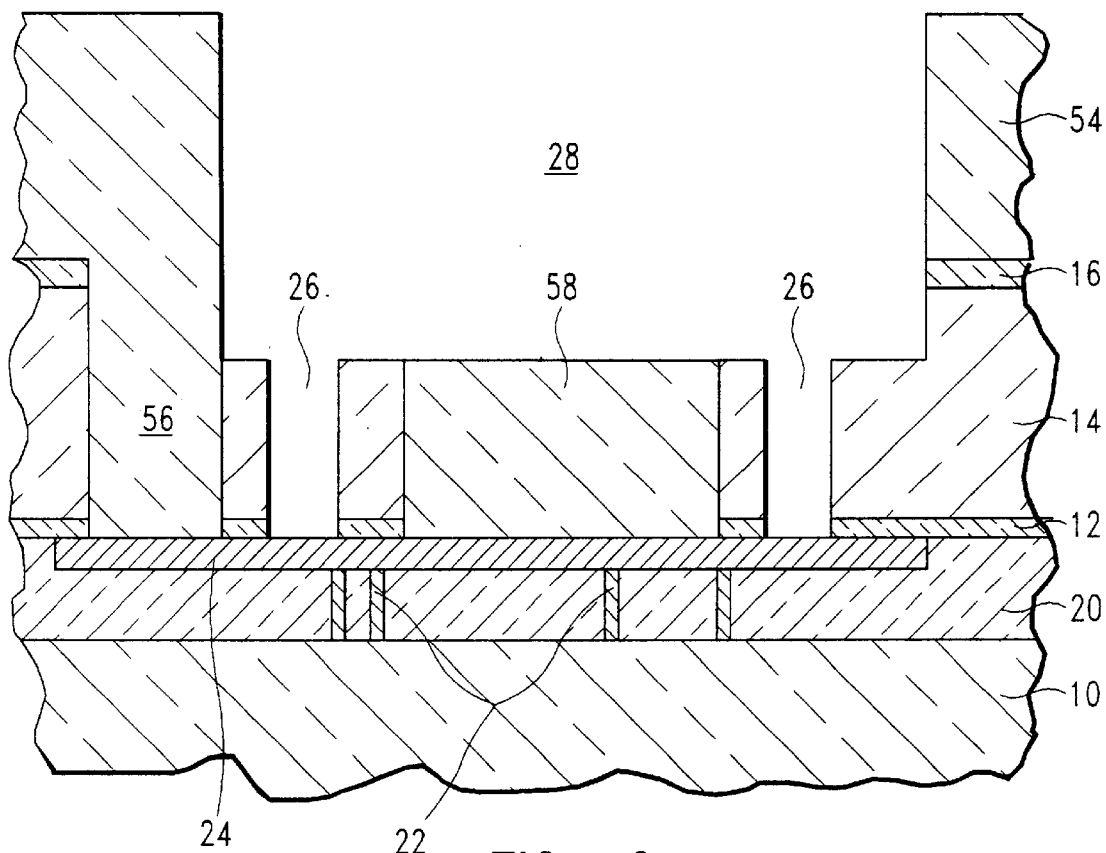

Referring now to FIG. 4C, a set of cavities for via-studs 26 and for interconnection lines 28 are next formed in the low-k dielectric 14 using the methods of double damascene as described above.

Figure 4D:
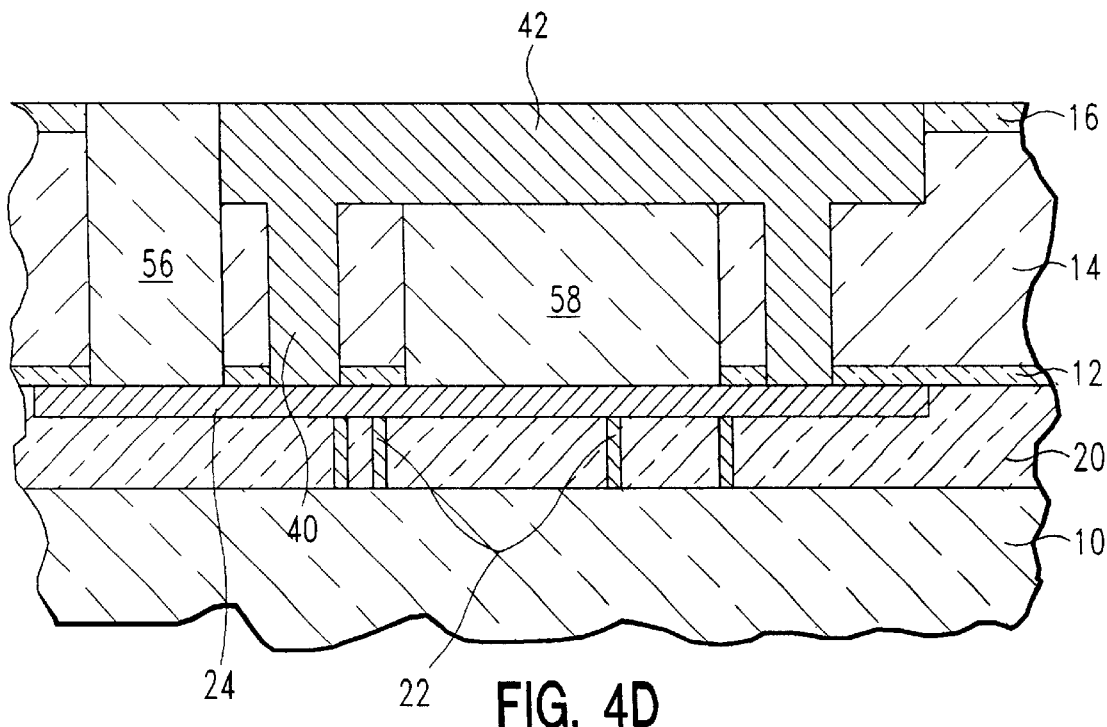

A sequence of barrier metal layers followed by electroplated copper is next deposited and chem-mech polished, again in accordance with double damascene methods as described above, to form a metallic wall comprised of stacked via-studs 40 and metal interconnection lines 42, thereby forming dual walls of dielectric 56, 58 and metal (via-studs 40 and interconnection lines 42) as shown in FIG. 4D.

As in the previous embodiment, the foregoing steps can be repeated to form stacked vias and interconnection lines.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming an edge seal along a periphery of an integrated circuit device to provide increased corrosion and oxidation resistance to metallization of the integrated circuit device, the method comprising the steps of:
   a. providing a semiconductor substrate having a metallic feature therein;
   b. depositing a layer of dielectric material over the semiconductor substrate and metallic feature, the layer of dielectric material comprising a low-k dielectric material;
   c. selectively removing a portion of the layer of dielectric material to form a cavity and expose a portion of the metallic feature;
   d. conformally depositing a layer of an insulation material in the cavity and over the layer of dielectric material, wherein the insulation material and dielectric material are different materials;
   e. removing horizontal portions of the layer of insulation material so as to expose at least the metallic feature in the cavity;
   f. depositing a barrier metal on the layer of insulation material in the cavity and on the exposed metallic feature;
   g. depositing a high conductivity metal in the cavity to fill the cavity; and
   h. planarizing the semiconductor substrate down to the layer of dielectric material to form said edge seal.

2. The method of claim 1 wherein the low-k dielectric material comprises SiLK or fluoridized polyimide.

3. The method of claim 1 wherein the layer of dielectric material comprises a bottom layer on the semiconductor substrate, the low-k dielectric material on the bottom layer and a top moisture barrier on the low-k dielectric material.

4. The method of claim 1 wherein the insulation material is selected from the group consisting of $SiO_2$, SiC, $Si_3N4$, $Al_2O_3$, diamond like carbon, polyimide and combinations thereof.

5. The method of claim 1 wherein the barrier layer is selected from the group consisting of tantalum, tantalum nitride, chromium/chromium oxide, titanium, titanium nitride, tungsten silicide and combinations thereof.

6. The method of claim 1 wherein the high conductivity metal is copper.

7. The method of claim 1 wherein the thickness of the insulation material in the cavity is 0.05 microns to 0.5 microns.

8. The method of claim 1 wherein the cavity comprises at least two contiguous cavities which form a damascene structure.

9. A method of forming an edge seal along a periphery of an integrated circuit device to provide increased corrosion and oxidation resistance to metallization of the integrated circuit device, the method comprising the steps of:

a. providing a semiconductor substrate having a metallic feature therein;
b. depositing a layer of dielectric material over the semiconductor substrate and metallic feature, the layer of dielectric material comprising a low-k dielectric material;
c. selectively removing a portion of the layer of dielectric material to form two first cavities and expose a portion of the metallic feature;
d. depositing an insulation material to fill the two first cavities, wherein the insulation material and dielectric material are different materials;
e. selectively removing a portion of the layer of dielectric material, and any overlying insulation material to form a second cavity and expose the metallic feature;
f. depositing a barrier metal in the second cavity and on the exposed metallic feature;
g. depositing a high conductivity metal in the second cavity to fill the cavity; and
h. planarizing the semiconductor substrate down to the layer of dielectric material to form said edge seal.

* * * * *